United States Patent

Haigis et al.

Patent Number: 5,929,673
Date of Patent: Jul. 27, 1999

[54] ULTRA LOW CURRENT POWER-UP SIGNAL SWITCHING CIRCUIT

[75] Inventors: John E. Haigis; Thomas V. McCaughey, both of Sherman, Tex.

[73] Assignee: Texas Instruments Incorporated, Dallas, Tex.

[21] Appl. No.: 08/838,341

[22] Filed: Apr. 8, 1997

Related U.S. Application Data

[60] Provisional application No. 60/015,207, Apr. 8, 1996.

[51] Int. Cl.⁶ .............................. H03L 7/00; H03K 3/02
[52] U.S. Cl. ........................................... 327/143; 327/198
[58] Field of Search ................................... 327/198, 546, 327/143, 142

[56] References Cited

U.S. PATENT DOCUMENTS

| | | | |
|---|---|---|---|
| 4,902,907 | 2/1990 | Haga et al. | 327/143 |
| 5,172,012 | 12/1992 | Ueda | 327/143 |
| 5,534,804 | 7/1996 | Woo | 327/143 |

FOREIGN PATENT DOCUMENTS

479202A2  8/1992  European Pat. Off. ............... 327/198

*Primary Examiner*—Timothy P. Callahan
*Assistant Examiner*—Hai L. Nguyen
*Attorney, Agent, or Firm*—Wade James Brady, III; Richard L. Donaldson

[57] ABSTRACT

A power-up switching circuit which comprises a source of voltage ($V_{CC}$) and a reference voltage circuit or voltage divider (R1, R2, N6) coupled to the source of voltage to provide a reference voltage. The reference voltage circuit also has a first switch (P5 and N5) in series therewith. Circuitry (MCAP1, P2, N2, P1, P4, D1) is provided including a first node (S2) responsive to ramping up of the voltage from the source of voltage at the first node to cause the reference voltage circuit including the first switch to be conducting to cause current to pass through the reference voltage circuit and provide a reference voltage. Circuitry (N1, D2) is provided which is responsive to arrival of the reference voltage at a predetermined voltage level to decrease the voltage at the first node sufficiently to electrically remove the first switch from the reference voltage circuit and disconnect the reference voltage circuit's current path from the source of voltage to ground. A second switch (P6) is coupled to the source of voltage and is responsive to the decrease of the voltage at the first node to couple the source of voltage to the circuitry (N1) to keep the first node (S2) low. Circuitry (P3, N3, P7, N7) is provided which is responsive to the decrease of the voltage at the first node to couple the source of voltage to the output terminal. The circuitry including a first node responsive to ramping up of the voltage from the source of voltage at the first node includes a capacitor coupled between the source of voltage and the first node.

24 Claims, 1 Drawing Sheet

ULTRA LOW CURRENT POWER-UP SIGNAL SWITCHING CIRCUIT

This application claims priority under 35 USC § 119(e)(1) of provisional application No. 60/015,207 filed Apr. 8, 1996.

BACKGROUND OF THE INVENTION

1. Field of the Invention

This invention relates to power-up signal switching circuits and, more specifically, to such circuits capable of relatively low current operation.

2. Brief Description of the Prior Art

To control whether or not the external outputs of a device are enabled during power up (i.e, ramping of the power signal ($v_{cc}$) from zero volts to its operating voltage), a signal is required which will switch and release control of the external outputs when the power signal has ramped up to some predetermined voltage level which is lower than the final operating level. To this end, a reliable reference has been required to accurately set the voltage level for the power-up signal switching circuit at which switching will take place. Typically, this has meant use of a voltage divider to provide a reference voltage with operation of the voltage divider at relatively high current levels, thereby dissipating a relatively large amount of power.

A favored characteristic of CMOS designs and a reason for their widespread use is their extremely low standby current ($I_{CC}$) consumption. Prior art power-up signal switching circuits have required current levels which exceed the level preferred in CMOS designs. It follows that prior art power-up signal switching circuits have not been easily made compatible with CMOS circuitry.

A problem with prior art power-up circuits is that they have not shut off the reference portion of the circuit after completion of power-up. Accordingly, the impedance of the reference portion of the circuit has been made very high in the prior art to reduce the current flow. This made the reference signal unstable as a result of the influence of parasitic currents. Also, the reference circuit current could not be reduced sufficiently for use in conjunction with CMOS devices. It is therefore apparent that a power-up switching circuit which is capable of operation at the low current levels compatible with CMOS designs and also capable of stable switching at the prescribed voltage level is highly desirable. This type of circuit requires a sufficiently strong and reliable reference during the power-up phase to switch when the appropriate voltage has been reached and then, after the switching is completed, essentially turn off or have an extremely low current requirement to provide very low to no current flow and low power dissipation. Though such circuitry is highly desirable and has been long sought, no such circuitry has been known to exist in the prior art.

SUMMARY OF THE INVENTION

In accordance with the present invention, there is provided a power-up control signal with steady-state current levels sufficiently low to be acceptable for use even in conjunction with CMOS devices, yet capable of providing a sufficiently strong and reliable reference during the power-up phase to provide proper and accurate switching.

Briefly, there is provided a signal switched at a predetermined minimum voltage level of the power signal ($v_{cc}$) to control the operational states of the output buffers during power-up. A CMOS latch is used to hold the level of the signal after it switches from the initial pre-ramp-up level to the final level. Blocking transistors are used to block the current paths in the circuit after the signal switches to the final power-up level. Prior to the signal switching, the current through the reference is sufficiently high to insure a good reliable voltage reference. After switching, the current path in the reference voltage circuit is opened by turning off an NMOS transistor in the lower portion of the voltage divider. It can therefore be seen that the only steady-state current present is from device leakage which is ultra-low.

BRIEF DESCRIPTION OF THE DRAWING

The FIGURE is a schematic diagram of an ultra-low current power-up signal switching circuit in accordance with the present invention.

DESCRIPTION OF THE PREFERRED EMBODIMENT

Figure 1:
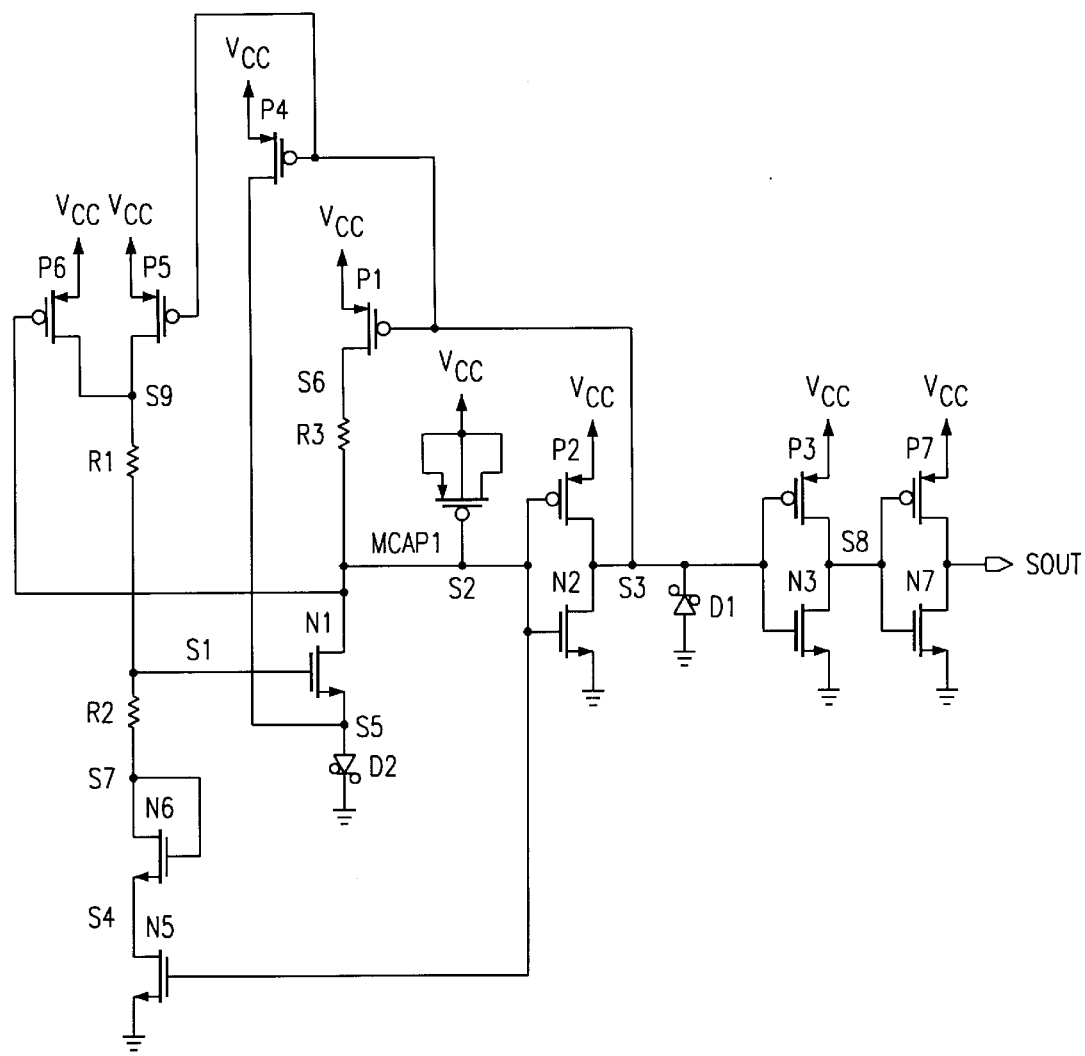

Referring to the FIGURE, the reference voltage circuitry is composed of the series circuit between $V_{CC}$ and ground of PMOS transistor P5, resistors R1 and R2, NMOS transistor N6 and NMOS transistor N5. During power-up, wherein the voltage from the voltage supply is applied to all of the terminals marked $V_{CC}$, capacitor MCAP1 couples the ramping voltage of $V_{CC}$ to node S2 and starts to ramp up the voltage at node S2 high. Diode D1 is a titanium disilicide diode and provides some reverse current to initially bias the voltage at node S3 low. Accordingly, during the initial ramp up of $V_{CC}$, node S2 will go high and node S3 will be held low. Because the voltage at node S2 is ramped high, transistor N5 of the voltage divider turns on and because node S3 is low, PMOS transistors P1, P4 and P5 are also turned on. When PMOS transistor P1 is turned on, it latches node S2 high through resistor R3. When PMOS transistor P4 is turned on, diode D2 is biased and node S5 is set to the $V_f$ of diode D2.

With transistors P5 and N5 now being turned on, there is provided essentially a voltage divider circuit, as described above, on top of a $V_t$ offset voltage provided by NMOS transistor N6. Accordingly, when $V_{CC}$ has ramped up to and arrives at the desired or predetermined voltage at which it is desired that switching take place, node S1 will be at one $V_t$ of NMOS transistor N1 plus the diode voltage drop across diode D2. This will cause NMOS transistor N1 to turn on and pull the voltage at node S2 low. The low voltage at node S2 turns on PMOS transistor P2 with NMOS transistor N2 being off. This causes the voltage at node S3 to go high and turn off PMOS transistors P1, P4 and P5. Also, since the voltage at node S2 went low first, transistor N5 is also turned off. This action turns off the current path of the reference voltage circuit. Concurrently, PMOS transistor P6 is turned on and biases node S1 to $V_{CC}$ to maintain NMOS transistor N1 in the on state.

The fact that the voltage at node S3 becomes high is an indication that $V_{CC}$ has reached a predetermined minimum level and activates the circuitry from node S3 to SOUT. This circuitry comprises sizing inverters and is required for buffering to prevent the load from influencing the voltage on node S3. If node S3 is high, PMOS transistor P3 will be off and NMOS transistor N3 will be on. This means that the voltage at node S8 will be low to turn on PMOS transistor P7 and turn off NMOS transistor N7. This provides a high output at the output terminal SOUT.

Resistors R1 and R2 are designed such that when $V_{CC}$ reaches a predetermined voltage, the voltage at node Si will be sufficiently high such that NMOS transistor N1 will turn on. However, no current will flow through PMOS transistor P6 because the current path therefrom has been opened by turning off NMOS transistor N5, thereby providing the desired result of low power dissipation in the reference voltage circuit. It can therefore be seen that PMOS transistor P6 in conjunction with NMOS transistor N1 act as a latch to maintain the final state after the circuit has switched.

One of the novel features of the above described circuit is to have reference set where there is a large amount of current during ramp up to allow low values of R1 and R2. This prevents a large parasitic current from disturbing the voltage at node S1. Also, a more robust reference voltage is provided and then shut off. The only current is from $V_{CC}$ through PMOS transistor P2 and diode D1 which is in the submicroampere range.

A useful application of the described circuit is to hold the external outputs of the device disabled, high-Z state, during power up, until $V_{CC}$ is sufficiently high that the operational control circuitry of the device can determine if the external outputs should be enabled. This eliminates, for example, the external outputs pulling the voltage on a bus high or low during power up, causing erroneous data to be placed on the bus.

It is therefore apparent that the reduction in current is the result of NMOS transistor N5 turning off after node S2 switches low and the diode biasing path through PMOS transistor P4 turning off after node S3 switches high. The operation of PMOS transistor P5 is to ensure, initially, that the voltage divider circuit is not enabled until after node S3 is biased low. After $V_{CC}$ has reached the predetermined switching level, PMOS transistor P6 turns on to hold node S1 high to ensure that NMOS transistor N1 remains turned on during the steady-state operation of the device.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A power-up switching circuit which comprises:
   (a) a source of voltage;
   (b) a reference voltage circuit coupled to said source of voltage to provide a reference voltage, said reference voltage circuit including first switching means;
   (c) circuitry including a first node responsive to ramping up of said voltage from said source of voltage at said first node to cause said reference voltage circuit including said first switching means to be conducting to cause current to pass through said reference voltage circuit and provide a reference voltage;
   (d) circuitry responsive to arrival of said reference voltage at a predetermined voltage level to decrease the voltage at said first node sufficiently to electrically remove said first switching means from said reference voltage circuit and disconnect said reference voltage circuit from said source of voltage; and
   (e) a second switch coupled to said source of voltage and responsive to said decrease of the voltage at said first node to couple said source of voltage to said reference voltage circuit.

2. The circuit of claim 1 wherein said reference voltage circuit is a voltage divider.

3. The circuit of claim 1 wherein said first switch has greater current carrying capability than said second switch.

4. The circuit of claim 2 wherein said first switch has greater current carrying capability than said second switch.

5. The circuit of claim 1 further including an output terminal and circuitry responsive to said decrease of said voltage at said first node to couple said source of voltage to said output terminal.

6. The circuit of claim 2 further including an output terminal and circuitry responsive to said decrease of said voltage at said first node to couple said source of voltage to said output terminal.

7. The circuit of claim 3 further including an output terminal and circuitry responsive to said decrease of said voltage at said first node to couple said source of voltage to said output terminal.

8. The circuit of claim 4 further including an output terminal and circuitry responsive to said decrease of said voltage at said first node to couple said source of voltage to said output terminal.

9. The circuit of claim 1 wherein said circuitry including said first node responsive to ramping up of said voltage from said source of voltage at said first node includes a capacitor coupled between said source of voltage and said first node.

10. The circuit of claim 2 wherein said circuitry including said first node responsive to ramping up of said voltage from said source of voltage at said first node includes a capacitor coupled between said source of voltage and said first node.

11. The circuit of claim 4 wherein said circuitry including said first node responsive to ramping up of said voltage from said source of voltage at said first node includes a capacitor coupled between said source of voltage and said first node.

12. The circuit of claim 8 wherein said circuitry including said first node responsive to ramping up of said voltage from said source of voltage at said first node includes a capacitor coupled between said source of voltage and said first node.

13. The circuit of claim 1 wherein said reference voltage circuit includes said first switch and a second switch couple in parallel and to said source of voltage, a pair of resistors having a second node therebetween for providing said reference voltage at said second node and a third switch responsive to said voltage at said first node to control operation of said reference voltage circuit.

14. The circuit of claim 2 wherein said reference voltage circuit includes said first switch and a second switch couple in parallel and to said source of voltage, a pair of resistors having a second node therebetween for providing said reference voltage at said second node and a third switch responsive to said voltage at said first node to control operation of said reference voltage circuit.

15. The circuit of claim 3 wherein said reference voltage circuit includes said first switch and a second switch couple in parallel and to said source of voltage, a pair of resistors having a second node therebetween for providing said reference voltage at said second node and a third switch responsive to said voltage at said first node to control operation of said reference voltage circuit.

16. The circuit of claim 4 wherein said reference voltage circuit includes said first switch and a second switch couple in parallel and to said source of voltage, a pair of resistors having a second node therebetween for providing said reference voltage at said second node and a third switch responsive to said voltage at said first node to control operation of said reference voltage circuit.

17. The circuit of claim 5 wherein said reference voltage circuit includes said first switch and a second switch couple in parallel and to said source of voltage, a pair of resistors having a second node therebetween for providing said reference voltage at said second node and a third switch responsive to said voltage at said first node to control operation of said reference voltage circuit.

18. The circuit of claim 6 wherein said reference voltage circuit includes said first switch and a second switch couple in parallel and to said source of voltage, a pair of resistors having a second node therebetween for providing said reference voltage at said second node and a third switch responsive to said voltage at said first node to control operation of said reference voltage circuit.

19. The circuit of claim 7 wherein said reference voltage circuit includes said first switch and a second switch couple in parallel and to said source of voltage, a pair of resistors having a second node therebetween for providing said reference voltage at said second node and a third switch responsive to said voltage at said first node to control operation of said reference voltage circuit.

20. The circuit of claim 8 wherein said reference voltage circuit includes said first switch and a second switch couple in parallel and to said source of voltage, a pair of resistors having a second node therebetween for providing said reference voltage at said second node and a third switch responsive to said voltage at said first node to control operation of said reference voltage circuit.

21. The circuit of claim 9 wherein said reference voltage circuit includes said first switch and a second switch couple in parallel and to said source of voltage, a pair of resistors having a second node therebetween for providing said reference voltage at said second node and a third switch responsive to said voltage at said first node to control operation of said reference voltage circuit.

22. The circuit of claim 10 wherein said reference voltage circuit includes said first switch and a second switch couple in parallel and to said source of voltage, a pair of resistors having a second node therebetween for providing said reference voltage at said second node and a third switch responsive to said voltage at said first node to control operation of said reference voltage circuit.

23. The circuit of claim 11 wherein said reference voltage circuit includes said first switch and a second switch couple in parallel and to said source of voltage, a pair of resistors having a second node therebetween for providing said reference voltage at said second node and a third switch responsive to said voltage at said first node to control operation of said reference voltage circuit.

24. The circuit of claim 12 wherein said reference voltage circuit includes said first switch and a second switch couple in parallel and to said source of voltage, a pair of resistors having a second node therebetween for providing said reference voltage at said second node and a third switch responsive to said voltage at said first node to control operation of said reference voltage circuit.

* * * * *